United States Patent
Shibata et al.

(10) Patent No.: US 12,183,686 B2
(45) Date of Patent: Dec. 31, 2024

(54) METHOD FOR PRODUCING ELECTRONIC COMPONENT DEVICE AND LAMINATED FILM USED THEREFOR

(71) Applicant: Showa Denko Materials Co., Ltd., Tokyo (JP)

(72) Inventors: Tomoaki Shibata, Tokyo (JP); Tsuyoshi Ogawa, Tokyo (JP); Xinrong Li, Tokyo (JP)

(73) Assignee: RESONAC CORPORATION, Tokyo (JP)

( * ) Notice: Subject to any disclaimer, the term of this patent is extended or adjusted under 35 U.S.C. 154(b) by 492 days.

(21) Appl. No.: 17/435,623

(22) PCT Filed: Mar. 5, 2020

(86) PCT No.: PCT/JP2020/009476
§ 371 (c)(1),
(2) Date: Sep. 1, 2021

(87) PCT Pub. No.: WO2020/179875
PCT Pub. Date: Sep. 10, 2020

(65) Prior Publication Data
US 2022/0157741 A1    May 19, 2022

(30) Foreign Application Priority Data
Mar. 6, 2019  (JP) ................................. 2019-040661

(51) Int. Cl.
*H01L 23/552* (2006.01)
*H01L 21/48* (2006.01)
(Continued)

(52) U.S. Cl.
CPC ........ *H01L 23/552* (2013.01); *H01L 21/4853* (2013.01); *H01L 21/4857* (2013.01);
(Continued)

(58) Field of Classification Search
CPC ............... H01L 23/552; H01L 21/4853; H01L 21/4857; H01L 21/565; H01L 21/568;
(Continued)

(56) References Cited

U.S. PATENT DOCUMENTS

2012/0098123 A1    4/2012   Yu et al.
2018/0337135 A1    11/2018  Yoshihiro et al.
(Continued)

FOREIGN PATENT DOCUMENTS

JP           3117971 B2    12/2000
JP        2007-242888 A     9/2007
(Continued)

*Primary Examiner* — Fernando L Toledo
*Assistant Examiner* — Neil R Prasad
(74) *Attorney, Agent, or Firm* — FITCH, EVEN, TABIN & FLANNERY, LLP

(57)  ABSTRACT

Disclosed is a method for producing an electronic component, the method including: disposing a plurality of electronic components on an adhesive layer of a composite substrate including a support, a temporary fixing material layer, and the adhesive layer with a connection part in contact with the adhesive layer interposed between the adhesive layer and the electronic components; fixing the plurality of electronic components to the composite substrate by curing the adhesive layer; forming a sealing layer sealing the electronic components; obtaining a sealed structure by peeling off the temporary fixing material layer from the adhesive layer; and a forming a circuit surface by grinding the sealed structure from the adhesive layer side. The plurality of electronic components include an IC chip and a chip-type passive component. The passive component is disposed on the adhesive layer by a method including in the following order: disposing a conductor precursor for pattern formation as the connection part on the adhesive layer; placing the passive component on the conductor
(Continued)

precursor; and forming a conductive pattern as the connection part by heating the conductor precursor.

9 Claims, 8 Drawing Sheets

(51) Int. Cl.
    *H01L 21/56* (2006.01)
    *H01L 23/00* (2006.01)
    *H01L 23/31* (2006.01)
    *H01L 23/538* (2006.01)
(52) U.S. Cl.
    CPC .......... *H01L 21/565* (2013.01); *H01L 21/568* (2013.01); *H01L 23/3128* (2013.01); *H01L 23/5383* (2013.01); *H01L 23/5386* (2013.01); *H01L 24/19* (2013.01); *H01L 24/20* (2013.01); *H01L 2224/214* (2013.01); *H01L 2924/19105* (2013.01); *H01L 2924/3025* (2013.01)
(58) Field of Classification Search
    CPC ............. H01L 23/3128; H01L 23/5383; H01L 23/5386; H01L 24/19; H01L 24/20; H01L 2224/214; H01L 2924/19105; H01L 2924/3025

See application file for complete search history.

(56) References Cited

U.S. PATENT DOCUMENTS

| | | | |
|---|---|---|---|
| 2018/0366407 | A1 | 12/2018 | Ooi et al. |
| 2019/0206799 | A1* | 7/2019 | Keser ................. H01L 23/5389 |

FOREIGN PATENT DOCUMENTS

| | | |
|---|---|---|
| JP | 2012-151353 A | 8/2012 |
| JP | 2014-063924 A | 4/2014 |
| JP | 2015-144165 A | 8/2015 |
| JP | 2018-041906 A | 3/2018 |
| JP | 2019-033124 A | 2/2019 |
| WO | 2017/057355 A1 | 4/2017 |
| WO | 2017/073630 A1 | 5/2017 |
| WO | 2018/221675 A1 | 12/2018 |

\* cited by examiner (e)

(f)

(g)

METHOD FOR PRODUCING ELECTRONIC COMPONENT DEVICE AND LAMINATED FILM USED THEREFOR

CROSS-REFERENCE TO RELATED APPLICATIONS

This application is a U.S. national phase application filed under 35 U.S.C. § 371 of International Application No. PCT/JP2020/009476, filed Mar. 5, 2020, designating the United States, which claims priority from International Application No. PCT/JP2019/029888, filed Jul. 30, 2019, and Japanese Application No. 2019-040661, filed Mar. 6, 2019, which are hereby incorporated herein by reference in their entirety.

TECHNICAL FIELD

The present invention relates to a method for producing an electronic component device and a laminated film used therefor.

BACKGROUND ART

As a method for producing a semiconductor package having a plurality of semiconductor chips, a method has been known in which semiconductor chips (dies) are arranged on a temporary adhesive layer provided on a carrier substrate, the semiconductor chips are sealed, and then the carrier substrate is peeled off (for example, Patent Literature 1).

CITATION LIST

Patent Literature

Patent Literature 1: International Publication WO 2017/057355

SUMMARY OF INVENTION

Technical Problem

It is expected that a composite electronic component device having an IC chip and a passive component can also be efficiently produced by a method of forming a sealing layer in a state where those component parts are temporarily fixed onto a temporary fixing material layer such as a temporary adhesive layer and then peeling off the temporary fixing material layer.

However, there is a problem of so-called die shifting that the IC chip and the passive component move from a predetermined position during the step of forming the sealing layer. In particular, in the case of collectively sealing a plurality of types of electronic components that are different in size and height, there is a concern that the problem of die shifting becomes more significant. In this regard, an aspect of the present invention provides a method of suppressing die shifting in the producing of an electronic component device.

Solution to Problem

An aspect of the present invention relates to a method for producing an electronic component device which includes a plurality of electronic components including an IC chip and a chip-type passive component. The method according to the aspect of the present invention includes:

preparing a composite substrate which includes a support, a temporary fixing material layer, and a curable adhesive layer laminated in this order;

disposing a plurality of electronic components on the adhesive layer of the composite substrate with a connection part in contact with the adhesive layer interposed between the adhesive layer and the electronic components;

fixing the plurality of electronic components to the composite substrate by curing the adhesive layer;

forming a sealing layer sealing the electronic components on the adhesive layer;

curing the sealing layer;

obtaining a sealed structure having the adhesive layer, the electronic components, and the sealing layer by peeling off the temporary fixing material layer from the adhesive layer; and forming a circuit surface on which the sealing layer and the connection part are exposed by grinding the sealed structure from the adhesive layer side.

The plurality of electronic components include an IC chip and a chip-type passive component. The IC chip has a main body part and a bump provided on one main surface side of the main body part. The IC chip is disposed on the adhesive layer in a direction in which the bump as the connection part is in contact with the adhesive layer. The passive component is disposed on the adhesive layer by a method including in the following order: disposing a conductor precursor for pattern formation as the connection part on the adhesive layer; placing the passive component on the conductor precursor; and forming a conductive pattern as the connection part by heating the conductor precursor.

Another aspect of the present invention relates to a laminated film for producing an electronic component device, the laminated film including: a temporary fixing material layer and a curable adhesive layer provided on the temporary fixing material layer, the laminated film being used for preparing the composite substrate in the above-described method.

Advantageous Effects of Invention

In the method according to the aspect of the present invention, since the sealing layer is formed in a state where the electronic components are fixed to the composite substrate by the cured adhesive layer, the electronic components are not easily moved.

DESCRIPTION OF EMBODIMENTS

Hereinafter, some embodiments of the present invention will be specifically described. However, the present invention is not limited to the following embodiments.

FIGS. 1, 2, 3, and 4 are process diagrams illustrating an embodiment of a method for producing an electronic component device which includes a plurality of electronic components including an IC chip and a chip-type passive component.

Figure 1:
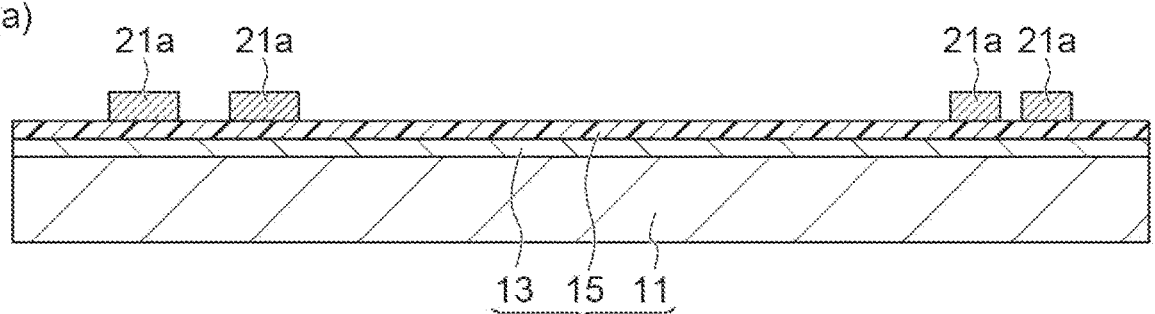
FIG. 1 is a process diagram illustrating an embodiment of a method for producing an electronic component device.
Figure 1:
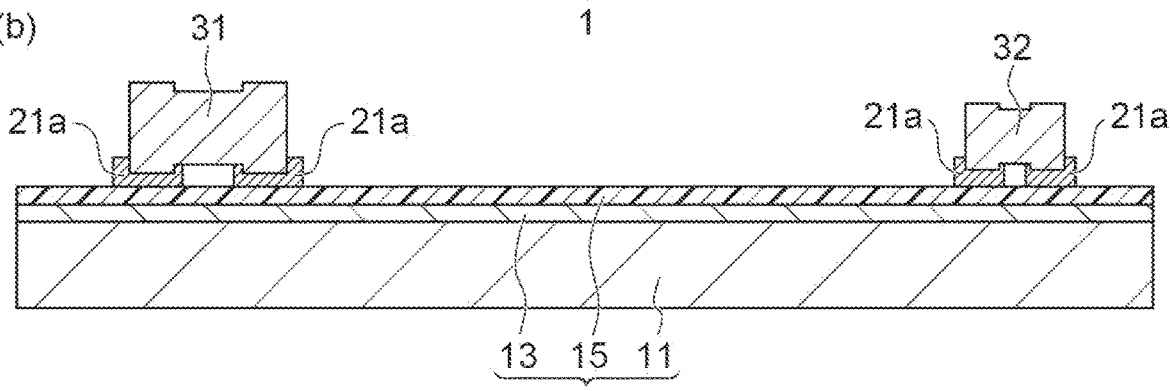
Figure 1:
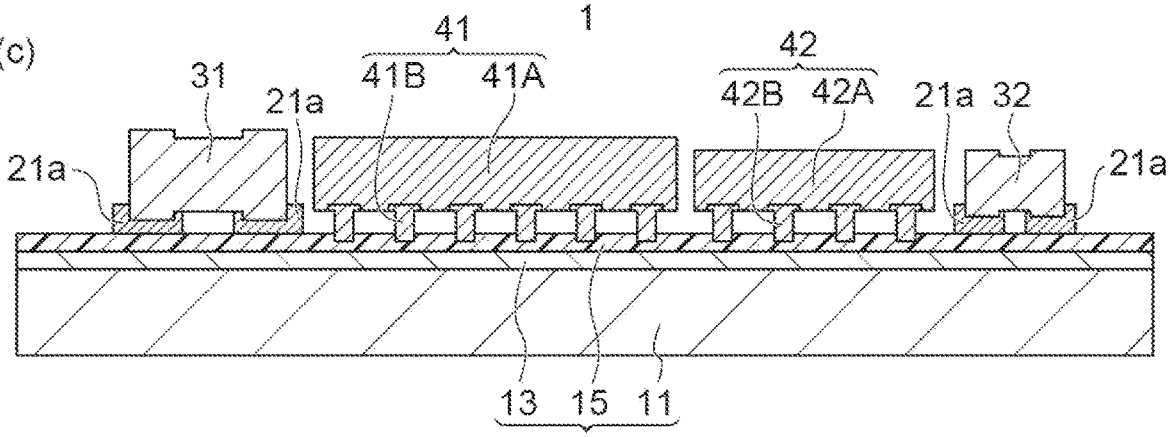
Figure 1:
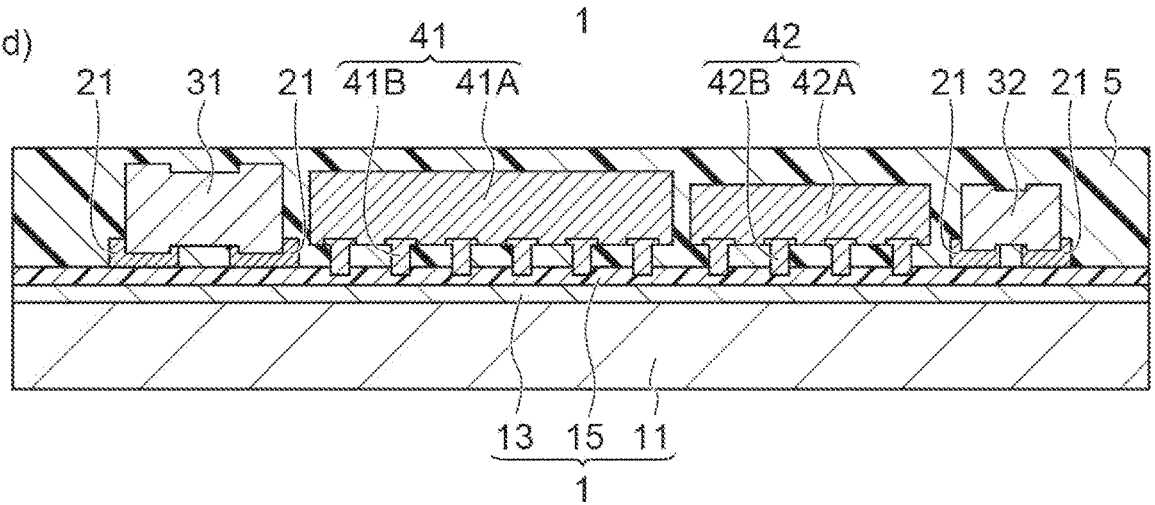
Figure 2:
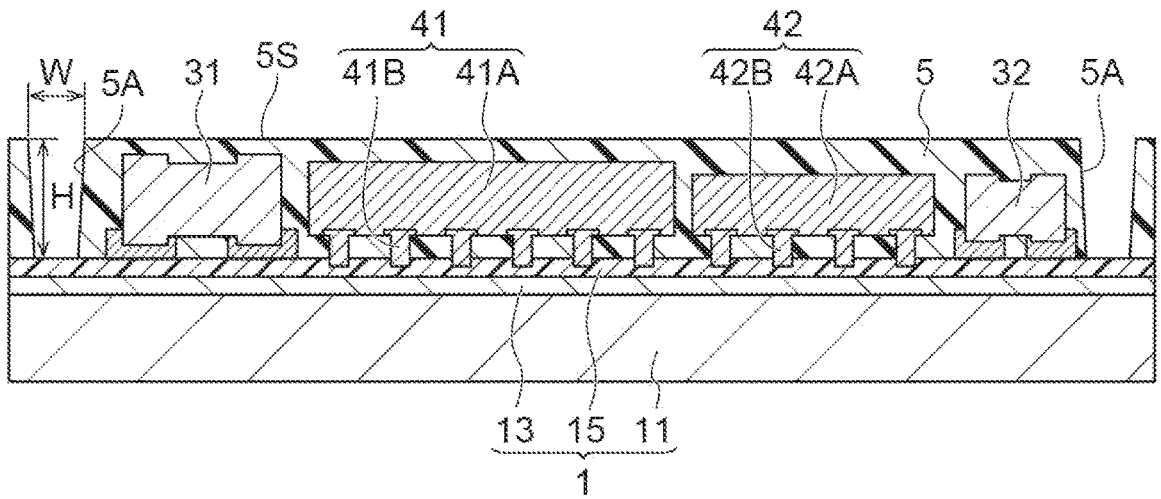
FIG. 2 is a process diagram illustrating an embodiment of the method for producing an electronic component device.
Figure 2:
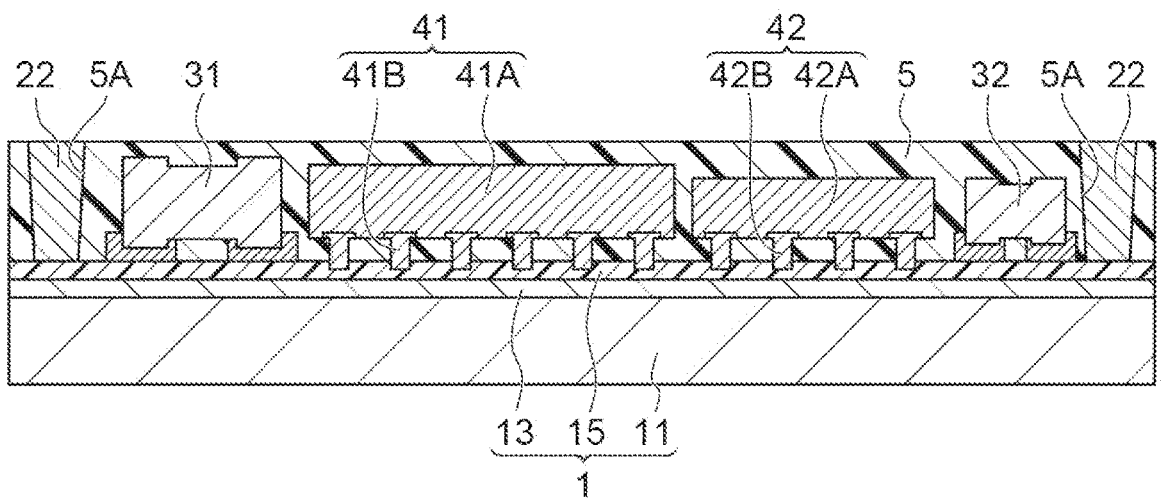
Figure 2:
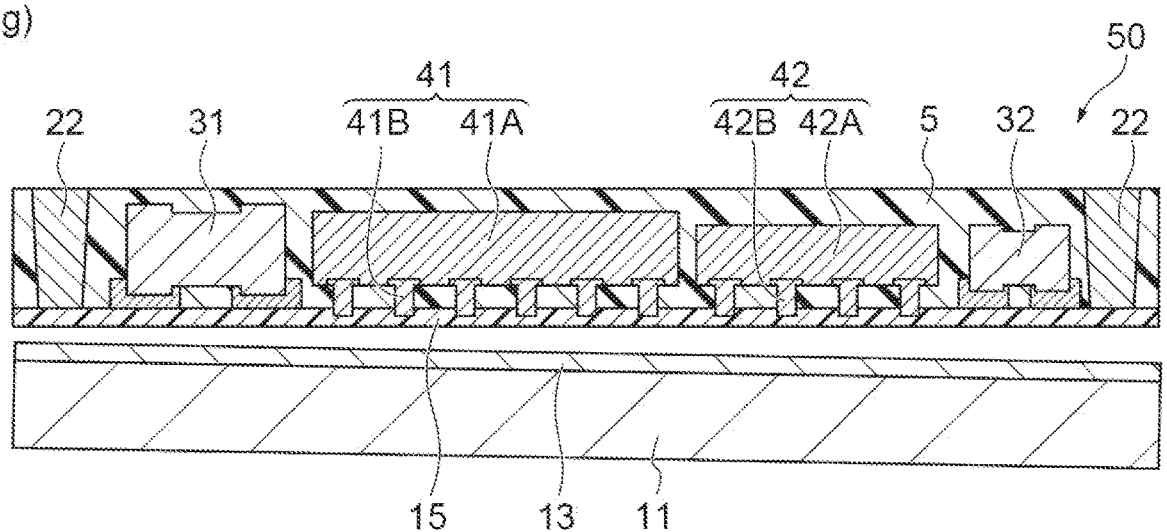
Figure 3:
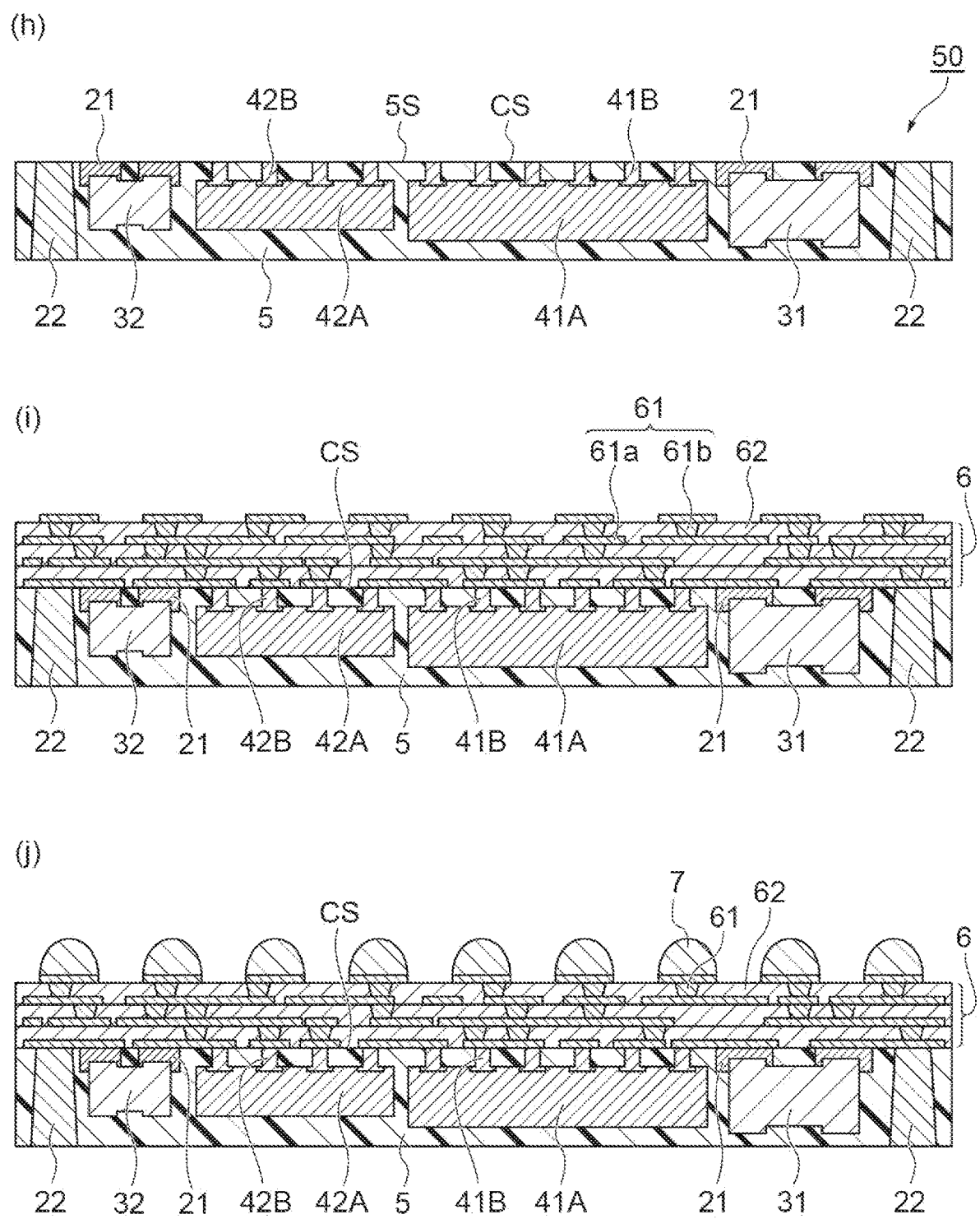
FIG. 3 is a process diagram illustrating an embodiment of the method for producing an electronic component device.

A composite substrate 1 illustrated in FIG. 1(*a*) is prepared. The composite substrate 1 includes a support 11, a temporary fixing material layer 13, and a curable adhesive layer 15. The temporary fixing material layer 13 and the adhesive layer 15 are laminated on the support 11 in this order.

It is sufficient that the support 11 has a degree of strength and stiffness that enables the electronic component to be supported, and a material therefor is not particularly limited. For example, the support 11 may be a silicon wafer, a glass plate, or a stainless steel plate. The thickness of the support 11 is not particularly limited, and may be, for example, 200 to 2000 μm. An alignment mark for positioning the electronic component may be provided on a surface on the temporary fixing material layer 13 side of the support 11. The alignment mark can be formed using an arbitrary material such as a metal or a resin. In the case of providing the alignment mark, the temporary fixing material layer 13 and the adhesive layer 15 may have a degree of transparency that enables the alignment mark to be visually recognized.

The adhesive layer 15 contains a curable adhesive that is irreversibly attached to an adherend after curing. The thickness of the adhesive layer 15 may be, for example, 1 to 50 μm. The curable adhesive forming the adhesive layer 15 may be selected from those known as an adhesive for a semiconductor (see, for example, International Publication WO 2017/073630 and Japanese Patent No. 3117971).

The curable adhesive forming the adhesive layer 15 contains, for example, a thermosetting resin and a curing agent thereof. The thermosetting resin is a compound that can form a cross-linked structure by heating. The thermosetting resin may have a molecular weight of 10000 or less. Examples of the thermosetting resin include an epoxy resin and an acrylic resin. The curing agent is a compound reacting with the thermosetting resin to form a cross-linked structure along with the thermosetting resin or a compound initiating a reaction in which the thermosetting resin forms a cross-linked structure. Examples of the curing agent include a phenol resin-based curing agent, an acid anhydride-based curing agent, an amine-based curing agent, an imidazole-based curing agent, a phosphine-based curing agent, an azo compound, and an organic peroxide. The curable adhesive may further contain other components such as a thermoplastic resin and a filler (for example, silica).

The temporary fixing material layer 13 has a degree of peeling property that enables the temporary fixing material layer 13 to be peeled off from the adhesive layer 15 after curing. The thickness of the temporary fixing material layer 13 may be, for example, 1 to 100 μm. A material forming the temporary fixing material layer 13 can be selected from materials that are used for temporary fixing or temporary attaching in the producing of an electronic component device (see, for example, Patent Literature 1).

The composite substrate 1 can be obtained, for example, by a method of sequentially forming the temporary fixing material layer 13 and the adhesive layer 15 on the support 11. The temporary fixing material layer 13 having a film shape and the adhesive layer 15 may be prepared respectively, and these may be sequentially laminated by thermal compression bonding. At this time, from the viewpoint of preventing air bubbles from being entrained, the temporary fixing material layer 13 having a film shape and the adhesive layer 15 may be laminated under reduced pressure. Alternatively, a laminated film having the temporary fixing material layer 13 and the adhesive layer 15 may be produced in advance and this laminated film may be laminated on the composite substrate 1.

FIG. 1(*a*) illustrates a step of disposing a conductor precursor 21*a* for pattern formation on the adhesive layer 15 of the prepared composite substrate 1. The pattern of the conductor precursor 21*a* includes a portion in which a passive component described below is disposed. The conductor precursor 21*a* can be disposed on the adhesive layer 15, for example, by a printing method such as screen printing.

The conductor precursor 21*a* may be cured by heating to form a conductor, and can be arbitrarily selected from conductor precursors that are generally used by those skilled in the art. For example, the conductor precursor 21*a* may be a curable conductive paste containing various metal particles or conductive particles such as carbon particles. The conductor precursor may be a transient liquid phase sintering-type metal adhesive containing metal particles in which transient liquid phase sintering can be performed. The details of the transient liquid phase sintering-type metal adhesive will be described below.

FIG. 1(*b*) illustrates a step of placing chip-type passive components 31 and 32 on the conductor precursor 21*a*. The passive components 31 and 32 are selected according to the design of an electronic component device, but for example, may be a resistor, a capacitor, or a combination thereof. The passive components 31 and 32 can be placed on the conductor precursor 21*a* using a general chip-mounting machine.

FIG. 1(*c*) illustrates a step of placing IC chips 41 and 42 on the adhesive layer 15. The IC chips 41 and 42 are so-called face-down type chip components having a main body part 41A or 42A and a plurality of bumps 41B or 42B arranged on one main surface side of the main body part 41A or 42A. The IC chips 41 and 42 are disposed on the adhesive layer 15 in a direction in which the bump 41B or 42B functioning as the connection part is in contact with the adhesive layer 15. Distal ends of the bumps 41B and 42B may be partially embedded in the adhesive layer 15. The IC chips 41 and 42 may be disposed on the adhesive layer 15 in a state where the main body parts 41A and 42A and the adhesive layer 15 are separated from each other. The IC chips 41 and 42 can be placed on the adhesive layer 15, for example, using a chip-mounting machine having a stage and a mounting head. By adjusting conditions of the stage and the mounting head such as a temperature and a pressure, some of the distal ends of the bumps 41B and 42B can be embedded in the adhesive layer 15.

The order of the passive components 31 and 32 and the IC chips 41 and 42 disposed on the adhesive layer 15 can be arbitrarily changed. The passive components 31 and 32 and the IC chips 41 and 42 are disposed on the adhesive layer 15 and then the adhesive layer 15 is cured. At the time point when the passive components 31 and 32 and the IC chips 41 and 42 are disposed on the adhesive layer 15, the adhesive layer 15 may be in a B-stage. The adhesive layer 15 is cured by heating in many cases. The passive components 31 and 32 and the IC chips 41 and 42 are strongly fixed to the composite substrate 1 by the cured adhesive layer 15. At the same time as the curing of the adhesive layer 15 or after the curing of the adhesive layer 15, by heating the conductor precursor 21a on which the passive components 31 and 32 are placed, a conductive pattern 21 that is a cured body of the conductor precursor 21a is formed. Thereby, the passive components 31 and 32 are fixed in a state where the conductive pattern 21 is interposed between the passive components 31 and 32 and the adhesive layer 15.

FIG. 1(d) illustrates a step of forming a sealing layer 5 sealing the IC chips 41 and 42 and the passive components 31 and 32 on the adhesive layer 15. The sealing layer 5 is formed to cover the entire of the IC chips 41 and 42 and the passive components 31 and 32 and to fill a gap between these electronic components and the adhesive layer 15. However, the gap may not be completely filled. The sealing layer 5 can be formed in a mold, for example, by a compression type or transfer type molding machine. Alternatively, the sealing layer 5 may be formed using a film-shaped sealing material (see, for example, International Publication WO 2015/186744). In this case, from the viewpoint of preventing air bubbles from being entrained, the film-shaped sealing material may be laminated under reduced pressure.

FIG. 2(e) illustrates a step of forming a via hole 5A extending toward the adhesive layer 15 from a surface 5S of the sealing layer 5 opposite to the adhesive layer 15, in the sealing layer 5. The via hole 5A may completely penetrate the sealing layer 5 and the sealing layer 5 may remain at the bottom part of the via hole 5A. The via hole 5A may be formed by an imprinting method of pushing a mold with respect to the surface 5S of the sealing layer 5 opposite to the adhesive layer 15. In the imprinting method, a mold having a protrusion corresponding to the via hole 5A is used. The protrusion of the mold may be pushed with respect to the surface 5S while heating the adhesive layer 15, the mold, or both of the adhesive layer 15 and the mold. Generally, after the via hole 5A is formed, the sealing layer 5 is cured by heating.

FIG. 2(f) illustrates a step of forming a conductive via 22 by filling a conductor precursor for a conductive via in the via hole 5A and then heating the conductor precursor in the via hole 5A. A method of filling the conductor precursor in the via hole 5A may be a printing method such as screen printing. The conductor precursor may be filled in the via hole 5A by performing printing in plural times. The conductor precursor may be filled in the via hole 5A under reduced pressure. By heating the conductor precursor in the via hole 5A, the conductive via 22 that is a cured body of the conductor precursor can be formed.

A maximum width W of the via hole 5A or the conductive via 22 may be, for example, 10 to 200 μm. A height H of the via hole 5A or the conductive via 22 may be, for example, 30 to 500 μm. Even when the height H of the conductive via 22 is large, in other words, even when the aspect ratio of the conductive via 22 is large, the conductive via 22 can be efficiently formed by an imprinting method and a method of using the conductor precursor.

The conductor precursor for a conductive via may be a conductive paste containing a plurality of metal particles and an organic binder in which the plurality of metal particles are dispersed. The conductive paste as the conductive precursor may be a transient liquid phase sintering-type metal adhesive containing a plurality of metal particles in which transient liquid phase sintering can be performed. In this case, the plurality of metal particles are fused together by the sintering of the conductive paste so as to form the conductive via 22 that is an electric body including a metal sintered body. Herein, "transient liquid phase sintering" is also referred to TLPS and generally means sintering proceeding by transition of a low-melting-point metal to a liquid phase due to heating at the particle interface and reaction diffusion of a high-melting-point metal to the formed liquid phase. According to the transient liquid phase sintering, the melting point of the metal sintered body to be formed can be higher than a heating temperature for sintering. When the conductive via is formed by heating at a low temperature, there is a tendency that the temporary fixing material layer 13 can be particularly easily peeled off from the adhesive layer 15.

The plurality of metal particles in which transient liquid phase sintering can be performed may include a combination of a metal having a high melting point and a metal having a low melting point. The plurality of metal particles may separately include first metal particles containing metal particles having a high melting point and second metal particles containing a metal having a low melting point, and the metal having a high melting point and the metal having a low melting point may be contained in one metal particle.

In a case where the conductor precursor contains the plurality of metal particles in which transient liquid phase sintering can be performed, the conductive via 22 can be formed by heating the conductor precursor at a temperature equal to or higher than the liquid phase transition temperature of the plurality of metal particles. The liquid phase transition temperature can be measured by DSC (differential scanning calorimetry) under a condition in which the plurality of metal particles are heated from 25° C. to 300° C. at a temperature increasing rate of 10° C./min in a nitrogen flow of 50 ml/min. In a case where the metal particles contain a plurality of types of metals, the temperature of liquid phase transition as observed at the lowest temperature is regarded as the liquid phase transition temperature of the metal particles. For example, the liquid phase transition temperature of a Sn-3.0Ag-0.5Cu alloy is 217° C.

In a case where the plurality of metal particles in which transient liquid phase sintering can be performed include a combination of the first metal particles containing a metal having a high melting point and the second metal particles containing a metal having a low melting point, the mass ratio of the first metal particles to the second metal particles may be 2.0 to 4.0 or 2.2 to 3.5.

The metal particles containing the metal having a high melting point and the metal having a low melting point can be obtained, for example, by forming, on surfaces of the metal particles containing one metal, a layer containing the other metal by plating, vapor deposition, or the like. The metal particles containing one metal and the metal particles containing the other metal may be formed into a composite by collision or the like.

The metal having a high melting point may be at least one selected from the group consisting of Au, Cu, Ag, Co, and Ni. The metal having a low melting point may be In, Sn, or a combination thereof. Examples of the combination of the metal having a high melting point and the metal having a low melting point include a combination of Au and In, a combination of Cu and Sn, a combination of Ag and Sn, a combination of Co and Sn, and a combination of Ni and Sn.

The combination of Cu and Sn generates a copper-tin metal compound ($Cu_6Sn_5$) by sintering. Since this reaction proceeds near 250° C., a conductor precursor containing the combination of Cu and Sn can be sintered by heating using a general facility such as a reflow furnace. Sn can be contained as a Sn metal simple substance or an alloy containing Sn in the metal particles. As an example of an alloy containing Sn, a Sn-3.0Ag-0.5Cu alloy is exemplified. The Sn-3.0Ag-0.5Cu alloy contains 3.0% by mass of Ag and 0.5% by mass of Cu on the basis of the mass of the alloy.

The content of the metal particles in the conductor precursor may be 80% by mass or more, 85% by mass or more, or 88% by mass or more and may be 98% by mass or less, on the basis of the mass of the conductor precursor. The content described herein refers to a ratio based on the total mass of components other than a solvent described below in a case where the conductor precursor contains the solvent.

The average particle diameter of the metal particles may be 0.5 µm to 80 µm, 1 µm to 50 µm, or 1 µm to 30 µm. The average particle diameter described herein refers to a volume average particle diameter as measured by a laser diffraction type particle size distribution analyzer (for example, Beckman Coulter, Inc., LS 13 320 type laser scattering/diffraction particle size distribution measuring apparatus).

The organic binder in the conductor precursor may contain a thermoplastic resin. The thermoplastic resin may have a softening point lower than the liquid phase transition temperature of the metal particles. The softening point of the thermoplastic resin refers to a value as measured by a thermomechanical analysis method. The softening point as measured by a thermomechanical analysis method is a temperature at the time point of observing displacement of 80 µm when a film having a thickness of 100 µm obtained by forming a thermoplastic resin into a film is compressed in a thickness direction at a stress of 49 mN while being heated at a temperature increasing rate of 10° C./min. As a measuring apparatus, for example, a thermomechanical analysis apparatus (TMA8320, manufactured by Rigaku Corporation, measuring probe: compression loading method standard model) is used.

The softening point of the thermoplastic resin may be a temperature lower by 5° C. or more, 10° C. or more, or 15° C. or more than the liquid phase transition temperature of the metal particle. The softening point of the thermoplastic resin may be 40° C. or higher, 50° C. or higher, or 60° C. or higher.

The thermoplastic resin may be include, for example, at least one selected from the group consisting of a polyamide resin, a polyamide-imide resin, a polyimide resin, and a polyurethane resin. The thermoplastic resin may include a polyoxyalkylene group or a polysiloxane group. The polyoxyalkylene group may be a polyoxyethylene group, a polyoxypropylene group, or a combination thereof.

The thermoplastic resin may be at least one resin, which includes a polyoxyalkylene chain or a polysiloxane chain, selected from the group consisting of a polyamide resin, a polyamide-imide resin, a polyimide resin, and a polyurethane resin. For example, by using a diamine compound having a polyoxyalkylene group or a polysiloxane group or a diol compound having a polyoxyalkylene group or a polysiloxane group as a monomer, a polyoxyalkylene group or a polysiloxane group can be introduced into these resins.

The content of the thermoplastic resin in the conductor precursor may be 5 to 30% by mass, 6 to 28% by mass, or 8 to 25% by mass on the basis of the mass of the conductor precursor. The content described herein refers to a ratio based on the total mass of components other than a solvent described below in a case where the conductor precursor contains the solvent.

The organic binder may contain a solvent and may contain a solvent and a thermoplastic resin. The solvent may be a polar solvent. The boiling point of the solvent may be 200° C. or higher and may be 300° C. or lower.

Examples of the solvent include alcohols such as terpineol, stearyl alcohol, tripropylene glycol methyl ether, diethylene glycol, diethylene glycol monoethyl ether (ethoxyethoxyethanol), diethylene glycol monohexyl ether, diethylene glycol monomethyl ether, dipropylene glycol-n-propyl ether, dipropylene glycol-n-butyl ether, tripropylene glycol-n-butyl ether, 1,3-butanediol, 1,4-butanediol, propylene glycol phenyl ether, and 2-(2-butoxyethoxy)ethanol; esters such as tributyl citrate, γ-butyrolactone, diethylene glycol monoethyl ether acetate, dipropylene glycol methyl ether acetate, diethylene glycol monbutyl ether acetate, and glycerin triacetate; ketones such as isophorone; lactams such as N-methyl-2-pyrrolidone; nitriles such as phenylacetonitrile; 4-methyl-1,3-dioxolane-2-one; and sulfolane. The solvent may be used singly or in combination of two or more kinds thereof.

The content of the solvent in the conductor precursor may be 0.1 to 10% by mass, 2 to 7% by mass, or 3 to 5% by mass on the basis of the mass of the conductor precursor.

The organic binder in the conductor precursor may further contain other components such as a thermosetting resin, rosin, an active agent, and a thixotropic agent.

Examples of the thermosetting resin include an epoxy resin, an oxazine resin, a bismaleimide resin, a phenol resin, an unsaturated polyester resin, and a silicone resin. Examples of the epoxy resin include a bisphenol A type epoxy resin, a bisphenol F type epoxy resin, a bisphenol S type epoxy resin, a phenol novolac type epoxy resin, a cresol novolac type epoxy resin, a naphthalene type epoxy resin, a biphenol type epoxy resin, a biphenyl novolac type epoxy resin, and a cyclic aliphatic epoxy resin.

Examples of the rosin include dehydroabietic acid, dihydroabietic acid, neoabietic acid, dihydropimaric acid, pimaric acid, isopimaric acid, tetrahydroabietic acid, and palustric acid.

Examples of the active agent include aminodecanoic acid, pentane-1,5-dicarboxylic acid, triethanolamine, diphenylacetic acid, sebacic acid, phthalic acid, benzoic acid, dibromosalicylic acid, anisic acid, iodosalicylic acid, and picolinic acid.

Examples of the thixotropic agent include 12-hydroxystearic acid, 12-hydroxystearate triglyceride, ethylenebisstearic acid amide, hexamethylenebisoleic acid amide, and N,N'-distearyl adipic acid amide.

The conductor precursor can be obtained by mixing metal particles and a component constituting an organic binder. An apparatus for mixing may be, for example, a three-roll mill, a planetary mixer, a sun-and-planet mixer, a planetary centrifugal stirring apparatus, a mortar machine, a biaxial kneader, or a thin layer shear disperser.

FIG. 2(g) illustrates a step of obtaining a sealed structure 50 having the adhesive layer 15, the passive components 31 and 32, the IC chips 41 and 42, and the sealing layer 5 by peeling off the temporary fixing material layer 13 from the adhesive layer 15. The outermost layer on one main surface side of the sealed structure 50 is the adhesive layer 15. The temporary fixing material layer 13 can be peeled off from the adhesive layer 15, for example, by heating, light irradiation, or mechanical peeling. A part of the adhesive layer 15 may be separated and removed along with the temporary fixing material layer 13.

FIG. 3(h) illustrates a step of grinding the sealed structure 50 from the adhesive layer 15 side to remove the adhesive layer 15 and thereby forming a circuit surface CS on which the sealing layer 5, the conductive pattern 21, the bumps 41B and 42B, and the conductive via 22 are exposed. The grinding of the sealed structure 50 can be performed using a general grinding apparatus. Some of the sealing layer 5, the conductive pattern 21, the bumps 41B and 42B, and the conductive via 22 may be ground.

FIG. 3(i) illustrates a step of providing or forming a rewiring layer 6 having wirings 61 connected to the conductive pattern 21, the bumps 41B and 42B, and the conductive via 22 and an insulating layer 62 (insulating film) provided between the wirings 61, on the circuit surface CS. The wiring 61 includes a multi-layer wiring layer 61a extending in a direction parallel to the main surface of the rewiring layer 6 and a linking part 61b extending in a direction perpendicular to the main surface of the rewiring layer 6. The thickness of each wiring layer 61a is not particularly limited, and may be, for example, 1 to 30 μm. The rewiring layer 6 can be formed by a general methods known by those skilled in the art. Regarding a method of forming a rewiring layer, for example, Japanese Patent No. 5494766 can be referred to.

FIG. 3(j) illustrates a step of disposing a solder ball 7 to be connected to the wiring 61 on the rewiring layer 6. The solder ball 7 is used as a connection terminal for secondary mounting. Reflow is performed as necessary.

Figure 4:
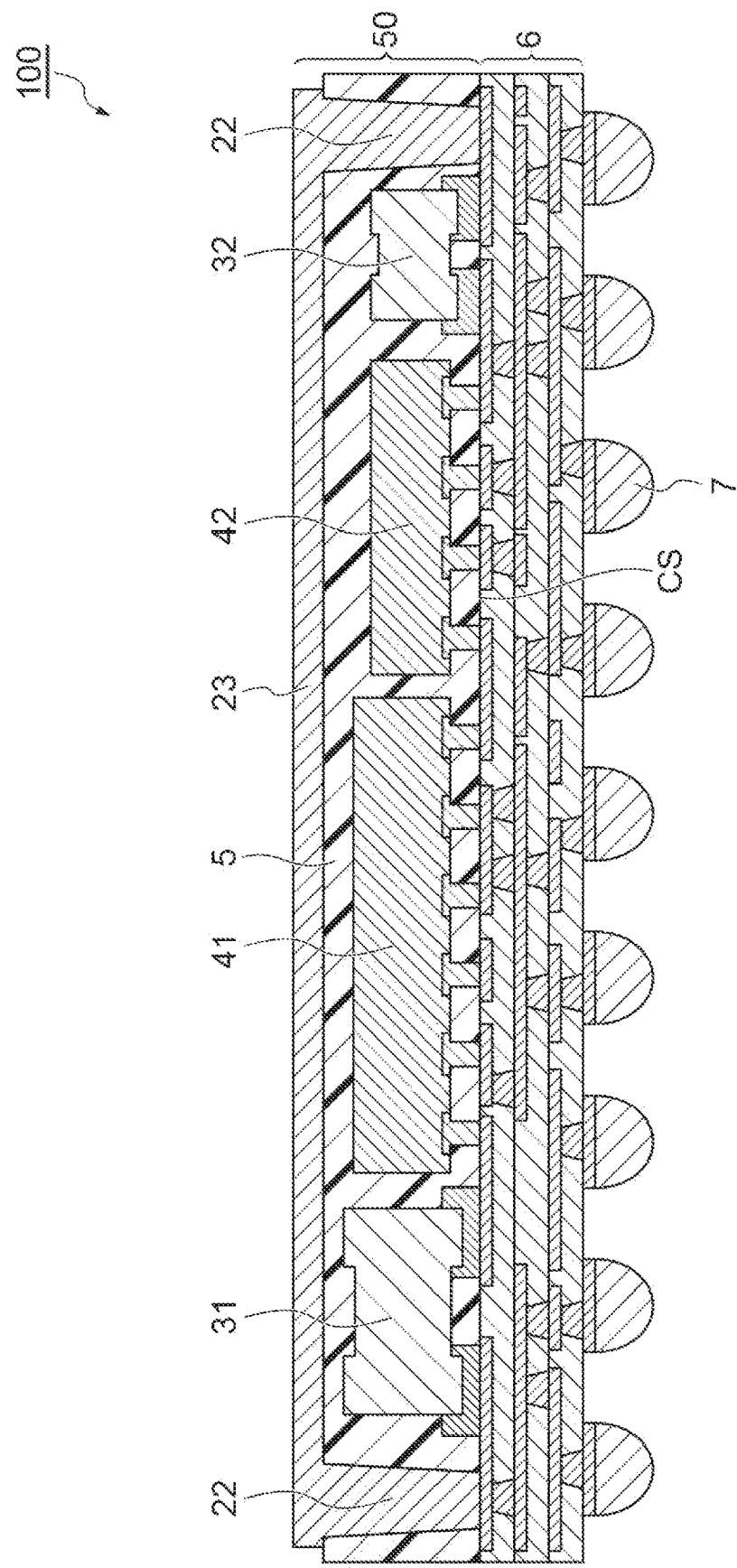
FIG. 4 is a process diagram illustrating an embodiment of the method for producing an electronic component device.

FIG. 4 illustrates a step of forming a conductive shield film 23 covering a surface of the sealing layer 5 opposite to the circuit surface CS and connected to the conductive via 22. Thereby, a target electronic component device 100 is obtained. The shield film 23 is provided mainly for the purpose of electromagnetic shielding. The shield film 23 can be a single layer of or a plurality of layers of a metal thin film, and these can be formed, for example, by a method such as sputtering or vapor deposition. The shield film 23 may be formed using the conductor precursor similar to that of the conductive pattern 21 or the conductive via 22. The electronic component device 100 includes the sealed structure 50 including the passive components 31 and 32, the IC chips 41 and 42, the sealing layer 5, the conductive via 22, and the shield film 23, and the rewiring layer 6 connected to the passive components 31 and 32 and the IC chips 41 and 42. A plurality of electronic component devices may be collectively formed using one composite substrate 1 and these may be divided.

Figure 5:
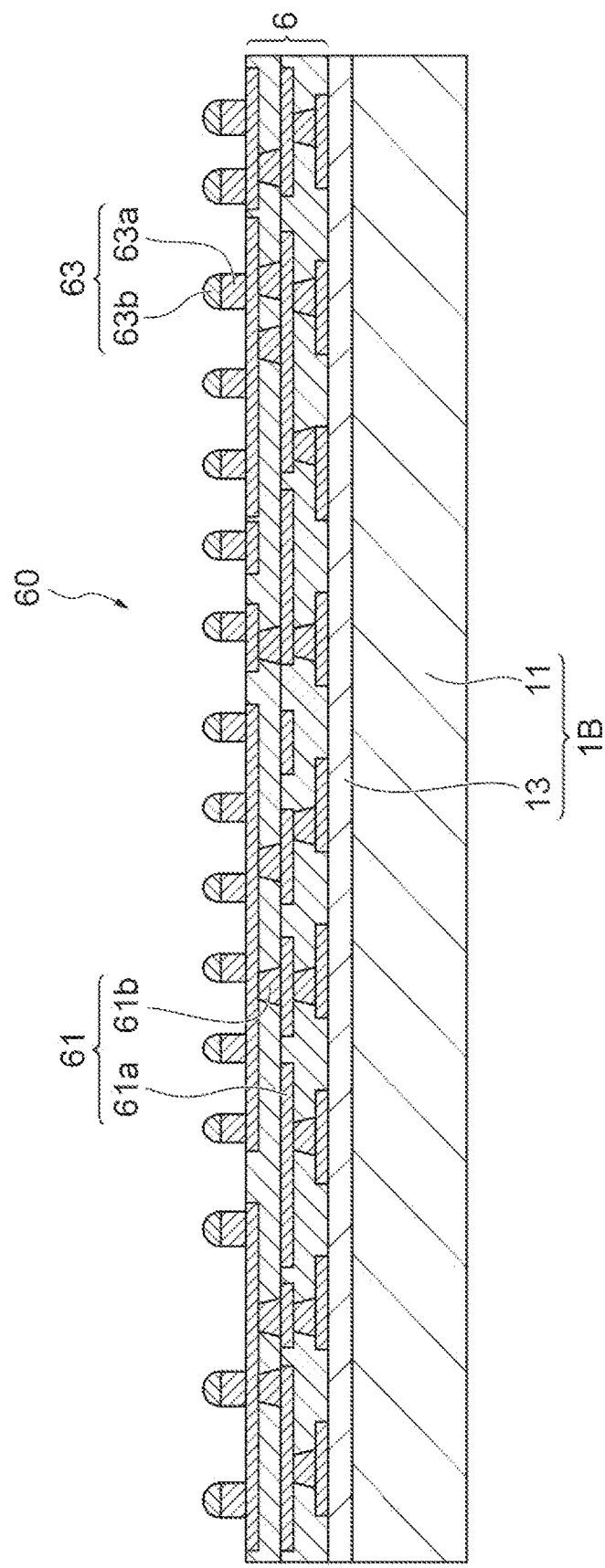
FIG. 5 is a process diagram illustrating an embodiment of the method for producing an electronic component device.

As exemplified in FIGS. 5, 6, 7, and 8, a rewiring structure having a rewiring layer is separately prepared, the rewiring structure and the sealed structure are connected to each other, and thereby the rewiring layer can be also provided on the circuit surface. In the case of this method, for example, as illustrated in FIG. 5, a rewiring structure 60 having the rewiring layer 6 having two facing main surfaces and a plurality of bumps 63 provided on the main surface of the rewiring layer 6 opposite to a carrier substrate 1B is formed on the carrier substrate 1B.

The carrier substrate 1B includes the support 11 and the temporary fixing material layer 13 provided on the support 11. The support 11 of the carrier substrate 1B and the temporary fixing material layer 13 can have configurations similar to those of the support 11 of the composite substrate 1 and the temporary fixing material layer 13.

The rewiring layer 6 has the wirings 61 and the insulating layer 62 provided between the wirings 61. The wiring 61 includes the multi-layer wiring layer 61a extending in a direction parallel to the main surface of the rewiring layer 6 and the linking part 6 1b extending in a direction perpendicular to the main surface of the rewiring layer 6. The thickness of each wiring layer 61a is not particularly limited, and may be, for example, 1 to 30 μm. The rewiring layer 6 can be formed by a general methods known by those skilled in the art, similarly to the rewiring layer of FIG. 3.

The bump 63 has, for example, a columnar part 63a in contact with the wiring 61 and a hemisphere part 63b provided on the columnar part 63a. The columnar part 63a may be formed from copper, and the hemisphere part 63b may be formed from a lead-free solder (for example, an alloy containing Sn and Ag). The size of the bump 63 is adjusted in a range that proper connection with the wiring 61 is secured. For example, the width of the bump 63 may be 5 to 100 μm, and the height of the bump 63 may be 5 to 50 μm. The bump 63 can be formed by a general method.

The prepared rewiring structure 60 may be inspected. The inspection includes, for example, checking whether there is abnormity caused by disconnection or short-circuiting between the wiring 61 and the bump 63. According to this inspection, before the rewiring structure 60 is connected to the sealed structure 50, a defective product of the rewiring structure 60 can be excluded. As a result, as compared to the case of forming a rewiring directly on an electronic component sealed in a sealing layer, it is possible to lower a possibility that a normal electronic component is excluded due to a defect in the formation of the rewiring.

Figure 6:
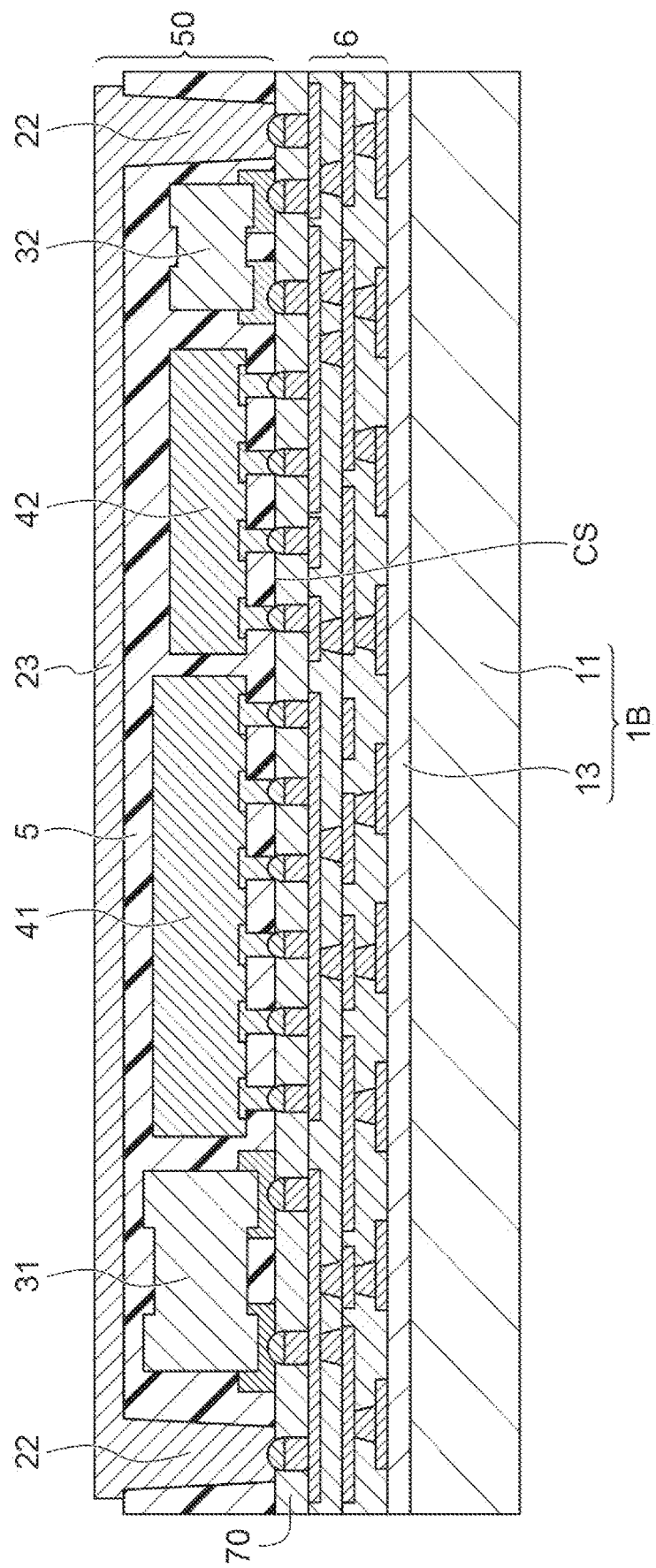
FIG. 6 is a process diagram illustrating an embodiment of the method for producing an electronic component device.

FIG. 6 illustrates an example of a step of connecting the sealed structure 50 and the rewiring structure 60 with an insulating adhesive layer 70 interposed therebetween. The sealed structure 50 and the rewiring structure 60 are attached to each other with the insulating adhesive layer 70 interposed therebetween in a direction in which the circuit surface CS and the bump 63 face each other. At this time, the sealed structure 50 and the rewiring structure 60 are positioned so that the connection parts (the conductive pattern 21 and the bumps 41B and 42B) and some of the plurality of bumps 63 are connected to each other. Thereby, the wiring 61 is connected to the connection parts ((the conductive pattern 21 and the bumps 41B and 42B) through the bump 63. For the connection between the connection parts (the conductive pattern 21 and the bumps 41B and 42B) and the bumps 63, the curing of the insulating adhesive layer 70, or both of the connection and the curing, the sealed structure 50 and the rewiring structure 60 may be bonded to each other while being heated and pressurized. The heating temperature may be, for example, 250° C. to 300° C., and the pressure may be 0.5 to 1 MPa. By connecting the connection parts (the conductive pattern 21 and the bumps 41B and 42B) and some of the plurality of bumps 63, the sealed structure 50 and the rewiring structure 60 are connected to each other. In the present specification, the expression "to be connected" means "to be electrically connected" in some cases.

The insulating adhesive layer 70 may be similar to a semiconductor adhesive that is generally used for attaching a semiconductor chip or the like to a circuit board. The insulating adhesive layer 70 may contain a curable adhesive similar to that of the adhesive layer 15. Before the sealed structure 50 and the rewiring structure 60 are connected to each other, the insulating adhesive layer 70 may be disposed on the circuit surface CS of the sealed structure 50.

A laminated film having a support film and an insulating adhesive layer provided on the support film may be prepared, and this insulating adhesive layer may be laminated on the circuit surface CS. Examples of a commercially available product of a laminated film that can be used therefor include NCF AK series manufactured by Hitachi Chemical Co., Ltd.

Figure 7:
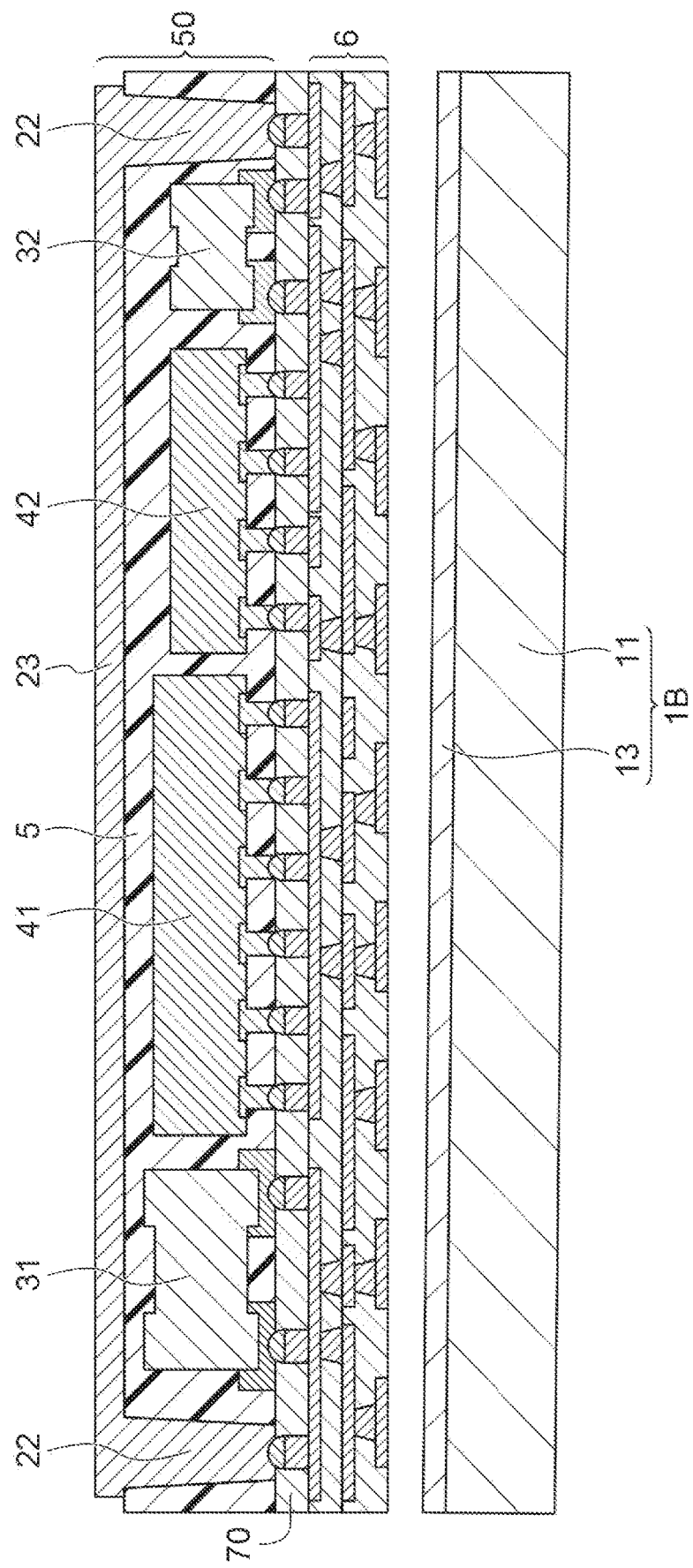
FIG. 7 is a process diagram illustrating an embodiment of the method for producing an electronic component device.

FIG. 7 illustrates an example of a step of peeling off the carrier substrate 1B from the rewiring structure 60 connected to the sealed structure 50. The temporary fixing material layer 13 of the carrier substrate 1B can be peeled off from the rewiring layer 6, for example, by heating, light irradiation, or mechanical peeling.

Figure 8:
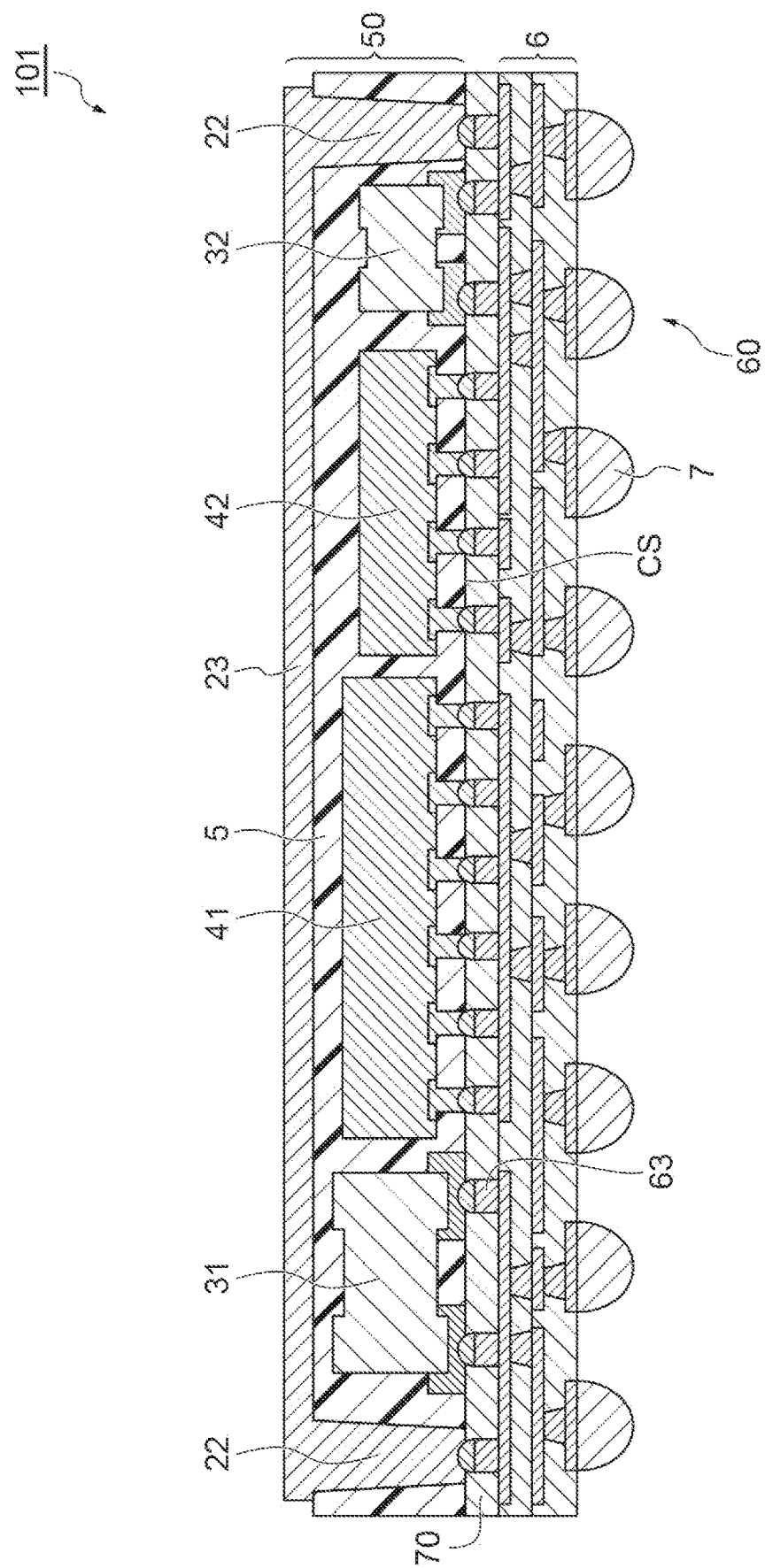
FIG. 8 is a process diagram illustrating an embodiment of the method for producing an electronic component device.

After the peeling-off of the carrier substrate 1B, as illustrated in FIG. 8, the solder ball 7 to be connected to the wiring 61 may be provided on the main surface of the rewiring layer 6 opposite to the sealed structure 50. The solder ball 7 is used as a connection terminal for secondary mounting. Reflow is performed as necessary.

An electronic component device 101 is obtained by the method exemplified above. The electronic component device 100 is mainly configured by the sealed structure 50, the rewiring structure 60, and the insulating adhesive layer 70 interposed between the sealed structure 50 and the rewiring structure 60 and attaching these structures to each other.

The method for producing an electronic component device is not limited to examples described above and can be changed as necessary. For example, the conductive via 22 or the shield film 23 may not be provided.

REFERENCE SIGNS LIST

1: composite substrate, 1B: carrier substrate, 5: sealing layer, 5A: via hole, 6: rewiring layer, 7: solder ball, 11: support, 13: temporary fixing material layer, 15: adhesive layer, 21: conductive pattern, 21a: conductor precursor, 22: conductive via, 23: shield film, 31, 32: passive component, 41, 42: IC chip, 41A, 42A: main body part, 41B, 42B: bump, 50: sealed structure, 60: rewiring structure, 61: wiring, 62: insulating layer, 63: bump, 70: insulating adhesive layer, 100, 101: electronic component device, CS: circuit surface.

The invention claimed is:

1. A method for producing an electronic component device, the method comprising, in the following order:
   preparing a composite substrate which includes a support, a temporary fixing material layer, and a curable adhesive layer laminated in this order;
   disposing a plurality of electronic components on the adhesive layer of the composite substrate with a connection part in contact with the adhesive layer interposed between the adhesive layer and the electronic components;
   fixing the plurality of electronic components to the composite substrate by curing the adhesive layer;
   forming a sealing layer sealing the electronic components on the adhesive layer;
   curing the sealing layer;
   obtaining a sealed structure having the adhesive layer, the electronic components, and the sealing layer by peeling off the temporary fixing material layer from the adhesive layer; and
   forming a circuit surface, the sealing layer and the connection part being exposed on the circuit surface, by grinding the sealed structure from the adhesive layer side, wherein
   the plurality of electronic components include an IC chip and a chip-type passive component,
   the IC chip has a main body part and a bump provided on one main surface side of the main body part,
   the IC chip is disposed on the adhesive layer in a direction in which the bump as the connection part is in contact with the adhesive layer, and
   the passive component is disposed on the adhesive layer by a method including in the following order: disposing a conductor precursor for pattern formation as the connection part on the adhesive layer; placing the passive component on the conductor precursor; and forming a conductive pattern as the connection part by heating the conductor precursor.

2. The method according to claim 1, further comprising:
   forming a via hole extending toward the adhesive layer from a surface of the sealing layer opposite to the adhesive layer, in the sealing layer;
   filling a conductor precursor for a conductive via in the via hole; and
   forming a conductive via by heating the conductor precursor in the via hole, wherein
   the sealed structure further has the conductive via, and the sealed structure is ground from the adhesive layer side such that the conductive via is exposed on the circuit surface along with the sealing layer and the connection part.

3. The method according to claim 2, wherein the via hole is formed by an imprinting method of pushing a mold against a surface of the sealing layer opposite to the adhesive layer, before curing the sealing layer.

4. The method according to claim 2, wherein the conductor precursor for a conductive via contains a plurality of metal particles and an organic binder in which the plurality of metal particles are dispersed, and
   when the conductor precursor is heated, the plurality of metal particles form a metal sintered body through transient liquid phase sintering so as to form the conductive via including the metal sintered body.

5. The method according to claim 2, further comprising forming a conductive shield film covering a surface of the sealing layer opposite to the connection part and connected to the conductive via.

6. The method according to claim 1, further comprising providing a rewiring layer having a wiring connected to the connection part on the circuit surface.

7. The method according to claim 6, wherein the rewiring layer is provided on the circuit surface by a method including:
   preparing a rewiring structure which includes the rewiring layer having facing two main surfaces and a plurality of bumps provided on one main surface of the rewiring layer, the wiring being connected to the plurality of bumps; and
   attaching the sealed structure and the rewiring structure to each other such that the connection part and at least a part of the plurality of bumps are connected to each other with an insulating adhesive layer interposed therebetween in a direction in which the circuit surface and the plurality of bumps face each other, and thereby connecting the sealed structure and the rewiring structure such that the wiring is connected to the connection part through the bump.

8. The method according to claim 7, wherein the rewiring structure is provided on a temporary fixing material layer of a carrier substrate including a support and the temporary fixing material layer provided on the support, and
   the method further comprises peeling off the carrier substrate from the rewiring structure after providing the rewiring layer on the circuit surface.

9. A laminated film for producing an electronic component device, the laminated film comprising: a temporary fixing material layer and a curable adhesive layer provided on the temporary fixing material layer, the laminated film being used for preparing the composite substrate in the method according to claim 1.

* * * * *